(12) United States Patent
Burns

(10) Patent No.: US 8,773,858 B2
(45) Date of Patent: Jul. 8, 2014

(54) MEANS FOR HEAT DISSIPATION FOR ELECTRICAL AND/OR ELECTRONIC APPARATUS

(75) Inventor: Gary Burns, Shipley (GB)

(73) Assignee: Pace Plc, Shipley (GB)

( * ) Notice: Subject to any disclaimer, the term of this patent is extended or adjusted under 35 U.S.C. 154(b) by 0 days.

(21) Appl. No.: 13/240,224

(22) Filed: Sep. 22, 2011

(65) Prior Publication Data

US 2012/0075802 A1  Mar. 29, 2012

(30) Foreign Application Priority Data

Sep. 24, 2010 (GB) .................................. 1016047.1

(51) Int. Cl.
*H05K 7/20* (2006.01)
*H04N 5/64* (2006.01)

(52) U.S. Cl.
CPC ............. *H04N 5/64* (2013.01); *H05K 7/20509* (2013.01)
USPC ........................ 361/710; 361/679.54; 174/548

(58) Field of Classification Search
USPC ........................ 361/676–678, 679.46–679.54, 361/688–722, 752, 796, 831
See application file for complete search history.

(56) References Cited

U.S. PATENT DOCUMENTS

| 5,424,913 A * | 6/1995 | Swindler .................. 361/679.54 |
| 5,835,348 A * | 11/1998 | Ishida ........................... 361/699 |
| 5,872,699 A * | 2/1999 | Nishii et al. .................. 361/699 |
| 5,969,940 A * | 10/1999 | Sano et al. ............... 361/679.52 |
| 6,025,991 A * | 2/2000 | Saito .............................. 361/704 |
| 6,084,769 A * | 7/2000 | Moore et al. ............. 361/679.47 |
| 6,181,553 B1 * | 1/2001 | Cipolla et al. ........... 361/679.54 |
| 7,130,193 B2 * | 10/2006 | Hirafuji et al. ................ 361/700 |
| 8,081,463 B2 * | 12/2011 | Chiu-Mao et al. ............ 361/702 |
| 8,199,507 B2 * | 6/2012 | Shohet et al. .................. 361/710 |
| 2005/0036292 A1 * | 2/2005 | Chengalva et al. ........... 361/715 |
| 2006/0076124 A1 * | 4/2006 | Sharifipour et al. ...... 165/104.15 |
| 2006/0114655 A1 | 6/2006 | Wallace |
| 2006/0215362 A1 | 9/2006 | Cho |
| 2006/0262500 A1 * | 11/2006 | Huang et al. .................. 361/687 |
| 2008/0115911 A1 | 5/2008 | Duesterhoeft |
| 2009/0321130 A1 * | 12/2009 | Greer et al. .................... 174/526 |

FOREIGN PATENT DOCUMENTS

JP  2000133961  5/2000

* cited by examiner

*Primary Examiner* — Courtney Smith
(74) *Attorney, Agent, or Firm* — Head, Johnson & Kachigian, P.C.

(57) ABSTRACT

The invention relates to heat dissipation means for use with electrical and/or electronic apparatus to provide for the improved cooling of at least one component within the housing of the apparatus. The heat dissipation means includes a first portion located internally of the housing at or adjacent to the at least one component to be cooled and the means is formed of a material to allow the same to be passed via the first portion to an interface and onto a second portion located externally of the housing to allow the heat to be dissipated therefrom to the external environment more effectively. This allows heat to be dissipated without the need for moving heat dissipation means to be provided and avoids the noise and/or vibration which can be created.

17 Claims, 3 Drawing Sheets

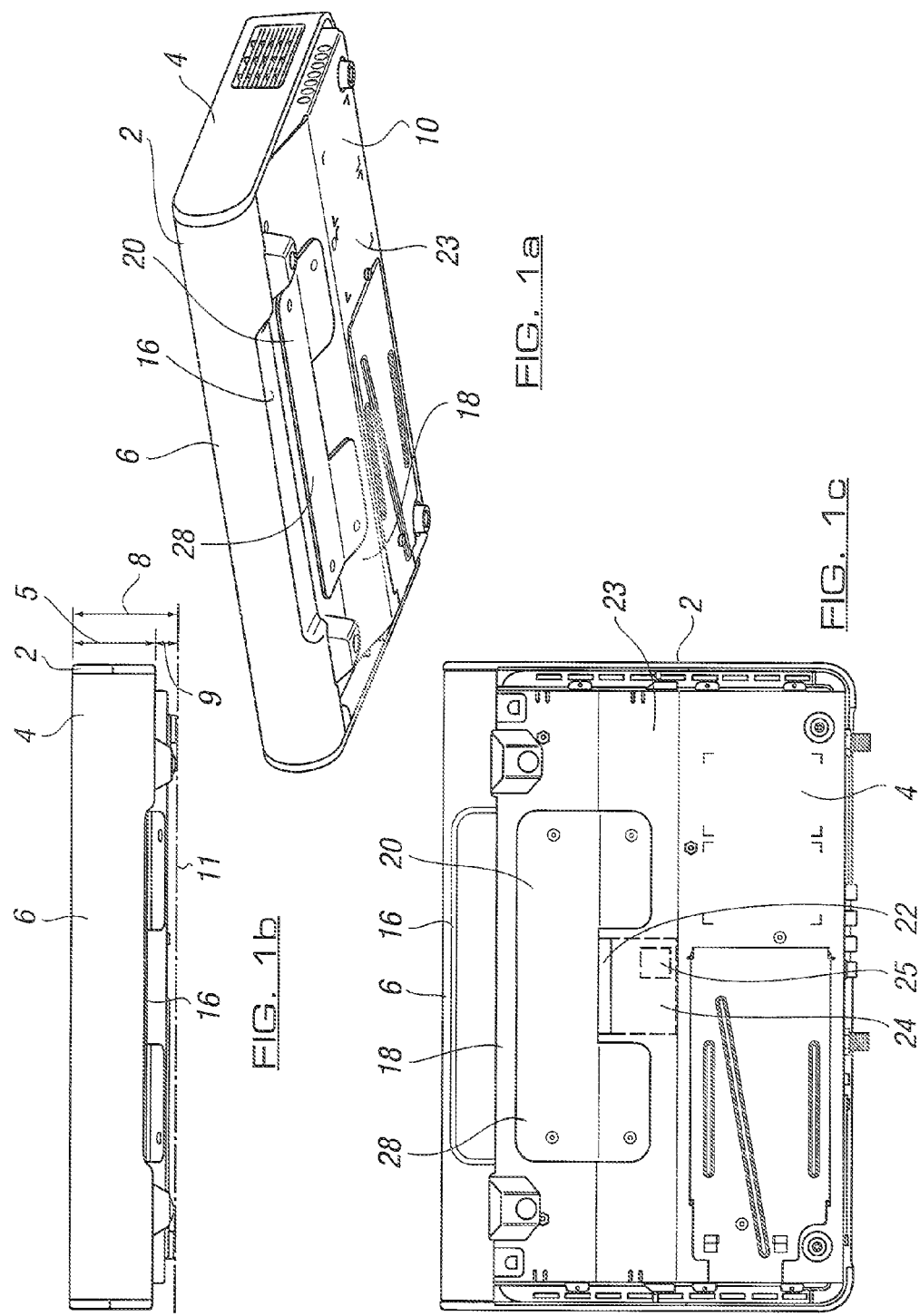

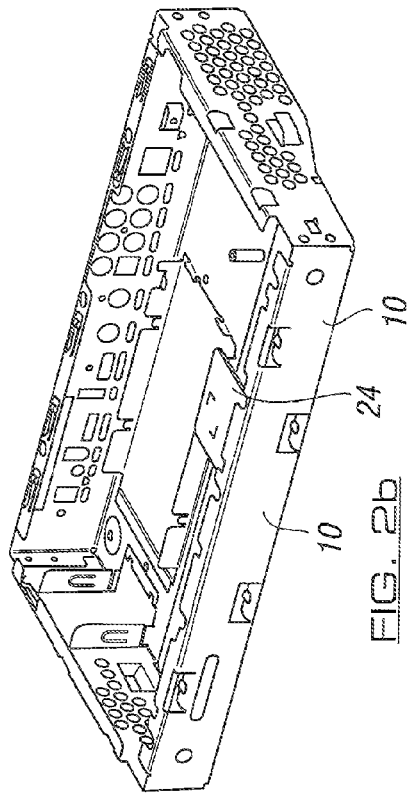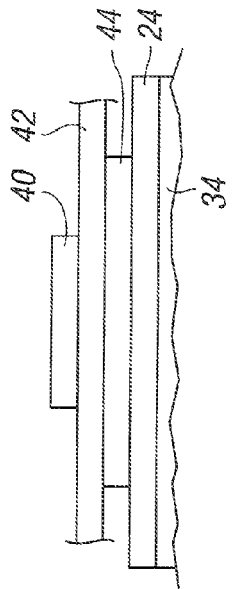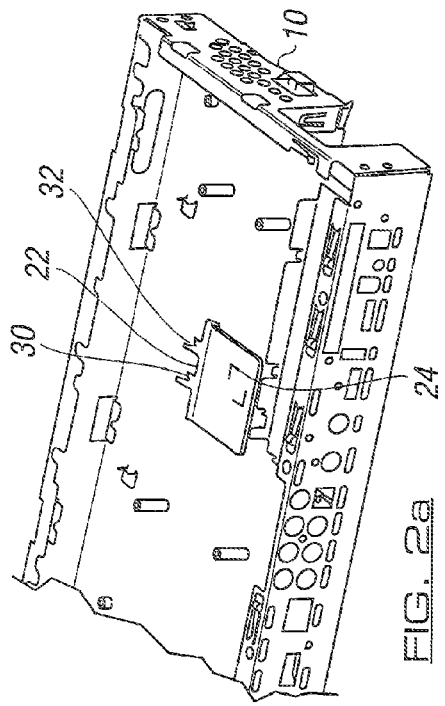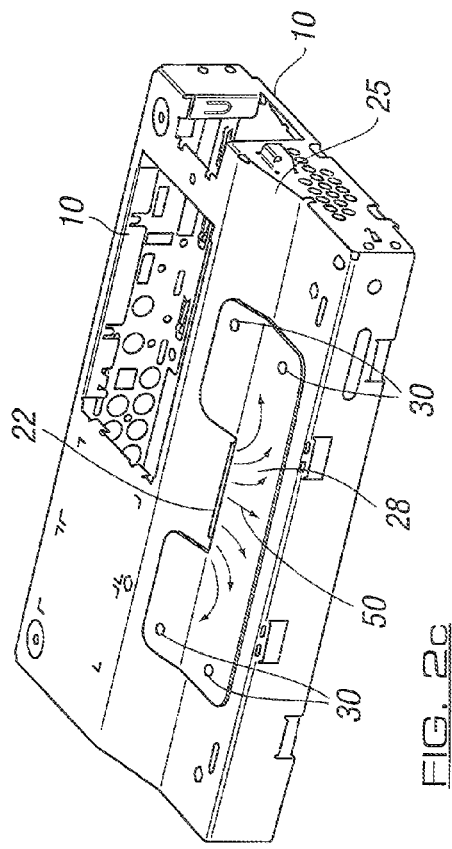

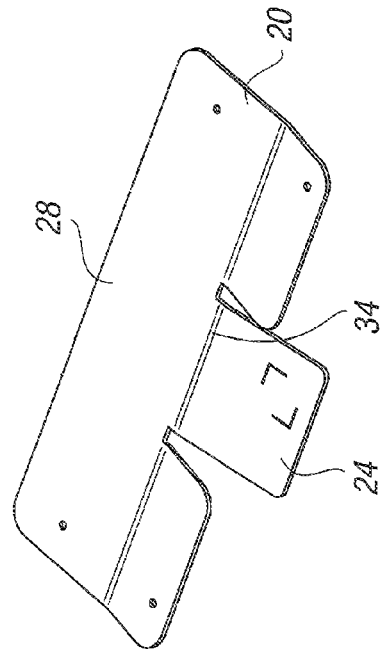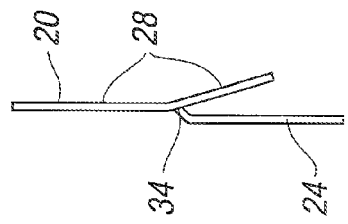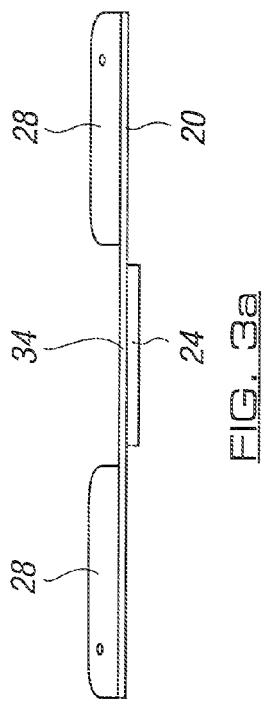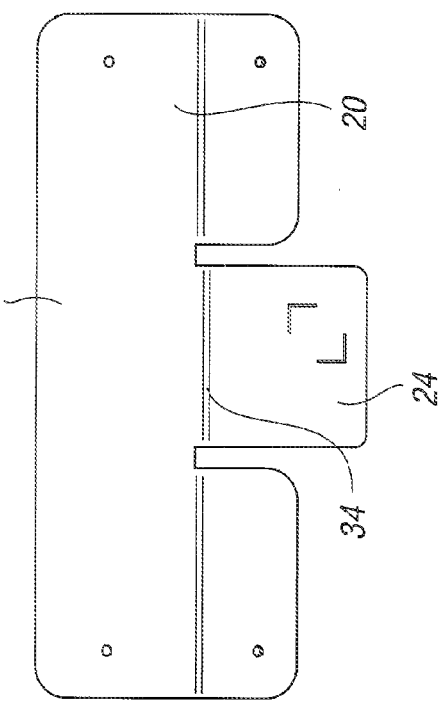

MEANS FOR HEAT DISSIPATION FOR ELECTRICAL AND/OR ELECTRONIC APPARATUS

BACKGROUND OF THE INVENTION

1. Field of the Invention

In electrical and electronic apparatus such as, although not necessarily exclusively, apparatus for receiving broadcast digital data, which apparatus is commonly referred to as a broadcast data receiver, personal video recorder or set-top box, there is a need to dissipate heat which is generated within the apparatus when the same is in use. The invention relates to electrical and electronic apparatus and the need to cool the same, and/or components therein, when in use, by allowing heat which is generated during use of the apparatus to be dissipated from the apparatus.

2. Prior Art

Conventionally, methods and means for dissipating heat which is generated within electrical apparatus, allow the cooling of the particular component within the apparatus which is creating the most heat but greater difficulty is experienced in removing the heat from within the outer housing of the apparatus and allowing the same to escape to the external environment. This can therefore cause a build up of heat within the housing and hence within the apparatus generally and this can, in certain circumstances, adversely affect the performance of the apparatus as a whole and/or specific components within the apparatus. The build up of excessive heat can also cause problems to the manufacturer if the level of the heat exceeds that which is specified by the end customer. In extreme situations the build up of heat can be such as to cause the apparatus to be a potential fire or damage hazard in the environment in which it is used, such as a domestic premises.

The above problem is further exacerbated by market trends to reduce the overall size of apparatus of this type so as to allow the same to be less obtrusive and hence regarded as more attractive for use at the location in the premises where the same is to be used. However, the reduction in size of the apparatus, combined with the higher core processor power of components used within the apparatus, means that in many cases, the limiting factor to the design of the electrical apparatus, and in particular the size of the same, is no longer the actual physical size of the components to be used in the apparatus but the ability of the apparatus to handle and dissipate the heat which is produced by the components within the space of the housing.

It is also known to be able to use electrical means such as fans to allow heat dissipation to be achieved but the noise and/or vibration of operation of these devices tends to be such as to cause the experience of using the apparatus to be adversely affected. For example if the apparatus is used to generate television and/or radio programs then the sound for the same can be masked or at least partially affected by the sound of operation of the cooling fan or fans of the apparatus.

There is therefore an accepted need to deal with the heat which is produced in order to keep the electronic components within the casing at a low enough temperature for the same to operate reliably and safely.

The aim of the present invention is to improve the efficiency of apparatus at transferring heat energy which is generated from components within the housing of an apparatus to the surrounding environment. A further aim is to provide apparatus which allows the heat to be dissipated by the use of means which do not create noise or vibration which can adversely effect the operation of the apparatus and/or prove to be irritating to users of the apparatus.

In a first aspect of the invention there is provided apparatus including a plurality of electrical and/or electronic components, at least one of which generates heat when in use and a housing which at least partially encloses said electrical and/or electronic components therein, characterised in that there is provided a heat dissipation means comprising a first portion located within the housing, which first portion is connected to or integral with a second portion located externally of the housing so as to allow the passage of heat from internally of the housing to externally of the housing via said portions of the heat dissipation means.

Typically the heat dissipation means is formed of a conductive material which allows the heat to be conducted from the first portion to the second portion.

In one embodiment, the first portion is directly contacted with at least one component within the housing which creates heat when in use and from which heat is required to be dissipated. Alternatively, the said first portion is located adjacent to the vicinity of the said at least one component which creates heat in use. Yet further, the said first portion may be indirectly contacted with the at least one heat producing component via a further heat dissipation or heat transfer means such as, for example, a gel pad.

Typically the said first and second portions are formed integrally from a sheet material.

In one embodiment, the sheet material which is used is aluminium which, in one embodiment can be coated if required.

In one embodiment, the interface which connects the said first and second portions, passes through at least one aperture provided in the housing so as to allow the second portion to lie externally of the housing and the first portion to lie internally of the housing.

Typically, one of the first or second portions is provided in electrical contact with the housing so as to create a ground connection between the heat dissipation means and the housing.

In one embodiment, the heat dissipation means is mechanically located with the housing via one or a plurality of engagement means. In one embodiment, the engagement means connect the second portion to the housing and are located on said portion at one or more areas where the heat is known to be at its least when the apparatus is in use. This therefore minimises the possibility of heat transferring back to the housing from said second portion via the engagement means. In addition, or alternatively, the material of the housing and/or a coating applied to the housing, at least in the vicinity of the second portion and/or connecting portion, is provided of a form so as to reduce or minimise the opportunity for heat to pass from the second portion or connecting portion back to the housing.

In one embodiment, the second portion of the dissipation means is located in a recessed portion of the housing which leads to a recess in at least one of the faces of the housing so as to allow the escape of the heated air from the recess and hence into the external environment.

In one embodiment, the area of the second portion of the dissipation means is greater than the area of the first portion. However, it should be appreciated that the design dimensions and shape of the said first and second portions of the heat dissipation means can be selected to suit particular design requirements for a particular form of apparatus.

In one embodiment, the one or more components which are to be cooled are integrated circuits or chips which are located on a printed circuit board within the housing.

Typically the apparatus is provided with means to receive and process digital data to allow the generation of television and/or radio programs.

In a further aspect of the invention there is provided a heat dissipation means, said heat dissipation means comprising a first portion and a second portion connected to or formed integrally therewith, said first portion provided for location within a housing of electrical apparatus for location at or adjacent to one or more components from which heat is required to be dissipated when in use and wherein the second portion is provided for location externally of the housing of the electrical apparatus and heat is transferred to the second portion from the first portion, to be dissipated to the external environment.

In one embodiment, the first and second portions of the heat dissipation means, are formed in parallel, offset, planes.

In one embodiment, the said heat dissipating means is formed of sheet metal such as aluminium.

In one embodiment the heat dissipation means include an interface portion provided intermediate the first and second portions. Typically the interface portion and first and second portions are integrally formed.

BRIEF DESCRIPTION OF THE DRAWINGS

Specific embodiments of the invention are now described with reference to the accompanying drawings wherein;

FIGS. 1a-c illustrate views of apparatus incorporating a heat dissipation means in accordance with one embodiment of the invention;

FIG. 2a-c illustrate views of the housing of the apparatus of FIG. 1; and

FIGS. 3a-d illustrate views of a heat dissipation means in accordance with one embodiment of the invention; and FIG. 4 illustrates a cross sectional elevation of one arrangement of the heat dissipating means with a component which is to be cooled in accordance with the invention.

DETAILED DESCRIPTION OF THE PREFERRED EMBODIMENTS

Referring to FIGS. 1a-c and 2a-c there is illustrated electrical apparatus 2 in the form of a set top box which is provided for the reception of broadcast digital data and the processing and/or storage of the same to allow the creation of television and/or radio programs for a user, which are typically viewed via a display screen and/or speakers connected to the apparatus.

Increasingly, apparatus of this type is required to contain a large number of components such as for example a number of tuners, a storage means, such as in the form of one or more hard drives and processing components so as to allow the digital data to be received, processed and stored, if required. At the same time, there is increasing pressure to reduce the overall size of the apparatus and this combination of requirements, means that it is increasingly difficult to reduce the heat which is generated within the apparatus to a sufficient extent to meet safety and/or end customer requirements.

A range of different heat dissipation means are already known and implemented but in many instances, these have been found to be insufficient for heat dissipation purposes.

In FIGS. 1a-c there is shown an item of electrical apparatus in the form of a broadcast data receiver 2 which has a housing 4 which defines the external dimensions of the apparatus. The housing has a front face 6 which is typically that which faces the user of the apparatus when in use and which may include control means and display means thereon (not shown). The front face 6 has a depth 5 which is less than the depth of the housing 8 towards the rear of the same. This means that the clearance 9 between the underside of the housing and the support surface 11 for the apparatus which is located under the printed circuit board (PCB) which typically has various components formed thereon and which is located within the housing is larger than normal. By locally reducing the depth 5 of the front face 6 of the apparatus 2 the front-panel height is reduced, which gives the impression of a low profile product, but also allows the creation of recess 16 and recess channel 18 depending from the front face and hence creates a path for warm air to flow towards and out from the front of the product. It should be appreciated that the provision of the recess channel 16, 18 could be repeated or alternatively provided from any face of the product housing.

The recess 16, and recess channel 18 provide a location for a heat dissipation mechanism or means 20 in accordance with the invention. The mechanism or means 20 pass through an aperture 22 in the base 23 of the housing with a first portion 24 shown in broken lines in FIG. 1c located within the housing and at the location of a processor component 25 shown in broken lines in FIG. 1c within the housing and located on the printed circuit board and which is required to be cooled. The second portion 28 is located externally of the housing in the recess 16,18 and is mounted to the housing by engagement means 30 positioned at the extremities of the portion 28 so that they conduct as little heat as possible back into the housing.

The first portion 24 of the dissipation means can be formed of any particular shape and/or at any particular location with regard to the second portion 28 so that the first portion lies in the appropriate location within the housing to lie adjacent to or in contact with the component or components from which heat is to be dissipated and hence provided the maximum cooling effect on the housing interior. Equally, the second portion 28 can be formed of any particular shape so as to provide a required cooling effect and dissipation of the heat from the first portion to the external environment but the said portions are formed integrally or joined together to allow the passage of heat from the first portion internally of the housing to the second portion externally of the housing.

Referring now to FIGS. 2a-b there is illustrated the lower part of the housing 10 of the apparatus with no components located within the same and with the top of the housing removed to show the interior of the same. The FIGS. 2a and b and FIG. 2c which shows the external underside of the housing, show how the first portion 24 of the heat dissipation means passes at the interface 34 with the second portion 28 through aperture 22 in the base of the housing. The first portion 24 lies in the interior of the housing so as to lie in the appropriate position to provide the cooling effect. It also shows the provision of contact means 30, 32 formed in the housing to create a ground connection between the heat dissipation means and the housing.

FIGS. 3a-d illustrate heat dissipation means 20 in accordance with one embodiment of the invention and the embodiment which is used with the apparatus shown in FIGS. 1 and 2. It will be seen how the first 24 and second 28 portions of the heat dissipation means are both formed in parallel planes but that the same are offset by the interface 34 and which interface is located to pass through the aperture 22 in the housing and hence locate the first portion 24 within the housing and the second portion externally 28 of the housing. Once again, as previously stated, the particular areas and shapes of the first and second portions can be selected to provide the particular cooling effect for a particular design of apparatus.

Turning now to FIG. 4, there is illustrated an example of a cooling assembly between a component and the first portion 24 of the heat dissipation means in accordance with the invention and in which the assembly includes a component 40, to be cooled such as an integrated circuit or chip. This chip is located on a printed circuit board 42 which is located within the housing of the apparatus. The base of the printed circuit board, is provided in contact with a heat dissipation gel pad 44 which allows the transfer of heat from the component and also allows improved mechanical location of the component with the heat dissipation means. The first portion 24 of the heat dissipation means in accordance with the invention are then provided in contact with the underside of the gel pad such that the first portion contacts with the same and heat transferred from the gel pad to the first portion then transfers, as indicated by arrows 50 in FIG. 2c, from the first portion 24 past interface 34 to the second portion 28, at which point the portion of the heat dissipation means 20 is exposed to the external environment as the second portion 28 lies outside of the housing.

There is therefore provided in accordance with the invention an effective and reliable manner of providing for the dissipation of heat from one or more components within the housing of electrical apparatus to the external environment without the need to use electrical means or other moveable components which can adversely affect the operation of the apparatus.

What is claimed is:

1. Apparatus including a plurality of electrical or electronic components, at least one of which generates heat when in use and a housing which at least partially encloses said electrical or electronic components therein, there is provided a heat dissipation means comprising a first portion located within the housing and a second portion located externally of the housing so as to allow the passage of heat from internally of the housing to externally of the housing via said portions of the heat dissipation means, and wherein said first portion is formed integrally with said second portion and an interface portion is provided between said first and second portions which is located to pass through an aperture formed in said housing and the second portion of the heat dissipation means is located in a recess channel of the housing and the heat dissipation means is mechanically located with the housing via one or a plurality of engagement means.

2. Apparatus according to claim 1 characterized in that the heat dissipation means is formed of a heat conductive material which allows the heat to be conducted from the first portion to the second portion.

3. Apparatus according to claim 1 characterized in that the first portion is directly contacted with at least one component within the housing which creates heat when in use and from which heat is required to be dissipated.

4. Apparatus according to claim 1 characterized in that the said first portion is located adjacent to said at least one component which creates heat in use.

5. Apparatus according to claim 1 characterized in that the said first portion is in indirect contact with the at least one heat producing component via a further heat dissipation or heat transfer means located between the said at least one component and heat dissipation means.

6. Apparatus according to claim 5 characterized in that the said first and second portions are formed from a sheet material.

7. Apparatus according to claim 6 characterized in that the sheet material which is used is aluminium.

8. Apparatus according to claim 1 characterized in that the heat dissipation means is provided in electrical contact with the housing so as to create a ground connection between the heat dissipation means and the housing.

9. Apparatus according to claim 1 characterized in that the engagement means connect the second portion to the housing and are located on said second portion at one or more areas of the housing.

10. Apparatus according to claim 1 characterized in that a material of the housing and/or a coating applied to the housing, at least in the vicinity of the second portion is of a form so as to minimise the opportunity for heat to pass from the second portion to the housing.

11. Apparatus according to claim 1 characterized in that the recess channel of the housing leads to a recess in at least one of the faces of the housing.

12. Apparatus according to claim 1 characterized in that the area of the second portion of the dissipation means is greater than the area of the first portion.

13. Apparatus according to claim 1 characterized in that the one or more components which are to be cooled are integrated circuits located on a printed circuit board within the housing.

14. Apparatus according to claim 1 characterized in that the first and second portions are provided in substantially parallel, offset, planes.

15. Apparatus according to claim 1 wherein the apparatus includes a data storage medium.

16. A heat dissipation means comprising:
a first portion and a second portion formed integrally therewith, characterised in that said first portion is provided for location within a housing of electrical or electronic apparatus for location at or adjacent to one or more components from which heat is required to be dissipated when in use and the second portion is provided for location externally of the housing in a recess channel of the housing and heat is transferred to the second portion from the first portion, to be dissipated externally of the housing and wherein said first and second portions are connected by an interface portion which is located to pass through an aperture in the housing wherein the heat dissipation means is mechanically located with the housing via one or a plurality of engagement means.

17. Heat dissipation means according to claim 16 characterized in that the first and second portions of the heat dissipation means are formed in substantially parallel, offset, planes.

* * * * *